United States Patent
Oyama et al.

(10) Patent No.: US 10,109,727 B2
(45) Date of Patent: Oct. 23, 2018

(54) SEMICONDUCTOR DEVICE

(71) Applicant: DENSO CORPORATION, Kariya, Aichi-pref. (JP)

(72) Inventors: Kazuhiro Oyama, Kariya (JP); Yasushi Higuchi, Kariya (JP); Seigo Oosawa, Kariya (JP); Masaki Matsui, Kariya (JP); Youngshin Eum, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/531,015

(22) PCT Filed: Dec. 8, 2015

(86) PCT No.: PCT/JP2015/006089
§ 371 (c)(1),
(2) Date: May 26, 2017

(87) PCT Pub. No.: WO2016/103603
PCT Pub. Date: Jun. 30, 2016

(65) Prior Publication Data
US 2017/0345919 A1    Nov. 30, 2017

(30) Foreign Application Priority Data
Dec. 26, 2014    (JP) .................................. 2014-265668

(51) Int. Cl.
*H01L 29/66*    (2006.01)
*H01L 29/778*    (2006.01)
(Continued)

(52) U.S. Cl.
CPC ............ *H01L 29/778* (2013.01); *H01L 29/06* (2013.01); *H01L 29/0657* (2013.01);
(Continued)

(58) Field of Classification Search
CPC . H01L 29/06; H01L 29/518; H01L 29/66462; H01L 29/778
(Continued)

(56) References Cited

U.S. PATENT DOCUMENTS

2005/0189559 A1    9/2005   Saito et al.
2006/0138454 A1    6/2006   Saito et al.
(Continued)

FOREIGN PATENT DOCUMENTS

JP    2011-228428 A    11/2011
JP    2013-229458 A    11/2013
(Continued)

*Primary Examiner* — Mohammed Shamsuzzaman
(74) *Attorney, Agent, or Firm* — Posz Law Group, PLC (57) ABSTRACT

A semiconductor device includes a lateral switching device having: a substrate; a channel forming layer that has a heterojunction structure made of a GaN layer and an AlGaN layer and is formed with a recessed portion, on the substrate; a gate structure part that includes a gate insulating film and a gate electrode formed in the recessed portion; and a source electrode and a drain electrode on opposite sides of the gate structure part on the channel forming layer. The AlGaN layer includes a first AlGaN layer that has an Al mixed crystal ratio determining a two dimensional electron gas density, and a second AlGaN layer that has an Al mixed crystal ratio smaller than that of the first AlGaN layer to induce negative fixed charge, and is disposed in contact with the gate structure part and spaced from the source electrode and the drain electrode.

1 Claim, 8 Drawing Sheets (51) Int. Cl.
*H01L 29/786* (2006.01)
*H01L 29/06* (2006.01)
*H01L 29/51* (2006.01)
*H01L 29/40* (2006.01)
*H01L 29/423* (2006.01)
*H01L 29/20* (2006.01)

(52) U.S. Cl.
CPC ........ *H01L 29/7786* (2013.01); *H01L 29/786* (2013.01); *H01L 29/2003* (2013.01); *H01L 29/402* (2013.01); *H01L 29/4236* (2013.01); *H01L 29/518* (2013.01); *H01L 29/66462* (2013.01)

(58) Field of Classification Search
USPC .......................... 257/192, 76, 194, 190, 200
See application file for complete search history.

(56) References Cited

U.S. PATENT DOCUMENTS

| | | | |
|---|---|---|---|
| 2006/0220065 | A1 | 10/2006 | Kawasaki et al. |
| 2009/0267078 | A1* | 10/2009 | Mishra ................ H01L 29/2003 257/76 |
| 2011/0073912 | A1* | 3/2011 | Marui ............... H01L 29/42316 257/194 |
| 2011/0233538 | A1 | 9/2011 | Iwakami et al. |
| 2012/0319165 | A1 | 12/2012 | Nakayama |
| 2014/0361337 | A1 | 12/2014 | Sugiyama et al. |
| 2015/0270355 | A1* | 9/2015 | Kuraguchi ............ H01L 29/778 257/194 |

FOREIGN PATENT DOCUMENTS

| | | |
|---|---|---|
| JP | 2013-229486 A | 11/2013 |
| JP | 2013-229499 A | 11/2013 |

* cited by examiner

SEMICONDUCTOR DEVICE

CROSS REFERENCE TO RELATED APPLICATIONS

This application is a U.S. national stage of International Patent Application No. PCT/JP2015/006089 filed on Dec. 8, 2015 and is based on Japanese Patent Application No. 2014-265668 filed on Dec. 26, 2014, the contents of which are incorporated herein by reference.

TECHNICAL FIELD

The present disclosure relates to a semiconductor device having a heterojunction structure made of gallium nitride (hereinafter referred to as GaN), which is a nitride semiconductor, and aluminum gallium nitride (hereinafter referred to as AlGaN).

BACKGROUND ART

Patent Literature 1 has proposed a semiconductor device including a HEMT (High electron mobility transistor), which is a field effect transistor, as a lateral switching device having a heterojunction structure with GaN.

The semiconductor device is provided with a lateral HEMT having a heterojunction structure made of GaN and AlGaN. Specifically, the semiconductor device has, on a substrate, a GaN-based semiconductor layer that includes a GaN electron transit layer and an AlGaN electron supply layer laid on top of another. The AlGaN electron supply layer is formed with a recessed portion, and the thickness of the AlGaN electron supply layer is reduced at the recessed portion. A gate electrode is disposed in the recessed portion. A source electrode and a drain electrode are disposed on the AlGaN electron supply layer on opposite sides of the gate electrode. The recessed portion has a gate embedding portion in which the gate electrode is disposed. The recessed portion further has a first recessed portion and a second recessed portion formed outside of the gate embedding portion, the first recessed portion being adjacent to the source electrode and the second recessed portion being adjacent to the drain electrode.

In the HEMT having such a structure, two-dimensional electron gas (hereinafter referred to as the 2 DEG) carrier is induced, by a piezoelectric effect and a spontaneous polarization effect, below the AlGaN electron supply layer, which are located on the opposite sides of the gate electrode. A current flows between the source and the drain through the 2 DEG carrier and a channel portion provided by a surface layer portion of the GaN electron transit layer under the gate electrode.

In such a HEMT, the thickness of the AlGaN electron supply layer is reduced by forming the recessed portion. Therefore, the stress is more reduced at the thin portion of the AlGaN electron supply layer where the recessed portion is formed than a thick portion of the AlGaN electron supply layer where the recessed portion is not formed. As such, an occurrence of the piezoelectric polarization is suppressed, and a 2 DEG density (hereinafter referred to as Ns) can be reduced. Accordingly, it is less likely that the blocking breakdown voltage will be reduced.

Further, there is known a structure that further has a first AlGaN cap layer and a second AlGaN cap layer on the AlGaN electron supply layer. The first AlGaN cap layer has an Al mixed crystal ratio smaller than that of the AlGaN electron supply layer, and the second AlGaN cap layer has an Al mixed crystal ratio greater than that of the first AlGaN cap layer.

In such a structure, the electron density Ns of the channel, which is the region only made of the single layer of the AlGaN electron supply layer, under the gate electrode, is not reduced, whereas the electron density Ns of the region made of the two layers including the first AlGaN cap layer and the AlGaN electron supply layer is reduced. That is, in the region only made of the single layer of the AlGaN electron supply layer, the 2 DEG carrier is formed based on positive fixed charge existing at a lower position of the AlGaN electron supply layer, resulting in a predetermined Ns. On the other hand, in the region made of the two layers including the first AlGaN cap layer and the AlGaN electron supply layer, negative fixed charge is generated in the surface layer portion of the AlGaN electron supply layer due to the first AlGaN cap layer. In this region, therefore, the positive fixed charge at the lower position of the AlGaN electron supply layer is offset, and thus the Ns is reduced.

The Ns is not reduced in the region made of three layers, which includes the first AlGaN cap layer, the second AlGaN cap layer and the AlGaN electron supply layer. Namely, in the region made of the three layers, since the influence of the fixed charge of the first AlGaN cap layer is reduced due to the positive fixed charge at the lower position of the second AlGaN cap layer, the Ns is not reduced.

As described above, since both the region where the Ns is reduced and the region where the Ns is not reduced are formed, the degradation of the blocking breakdown voltage is suppressed, and an increase in the on resistance can be suppressed.

PRIOR ART LITERATURE

Patent Literature

Patent Literature 1: JP 5093991 B2

SUMMARY OF INVENTION

However, it has been confirmed that a relationship between the thickness and the stress of the AlGaN electron supply layer substantially has a criticality, and the sensitivity of the Ns relative to the thickness is extremely high (see FIG. 2, which will be described later). Therefore, the Ns largely changes even with a small change of the thickness of the AlGaN electron supply layer. For this reason, it is difficult to control the Ns.

On the other hand, in the structure where the first and second AlGaN cap layers are arranged on the AlGaN electron supply layer, there are regions where the Ns is reduced and where the Ns is not reduced. In such a structure, however, the 2 DEG carrier is in a state of being connected. Therefore, the device cannot be made in a normally-off device.

It is an object of the present disclosure to provide a semiconductor device which is capable of restricting the degradation of the blocking breakdown voltage with favorable controllability and of restricting the increase in an on resistance, as in a normally-off device.

According to an aspect of the present disclosure, a semiconductor device includes a lateral switching device having a substrate, a channel forming layer, a gate structure part, a source electrode and a drain electrode. The substrate is formed of a semi-insulating material or a semiconductor material. The channel forming layer is disposed on the substrate, and includes a heterojunction structure made of a GaN layer forming an electron transit layer and an AlGaN layer forming an electron supply portion. The channel forming layer has a recessed portion at which the AlGaN layer is partly removed. The gate structure part includes a gate insulating film disposed in the recessed portion and a gate electrode disposed on the gate insulating film. The source electrode and the drain electrode are disposed on the channel forming layer on opposite sides of the gate structure part. The lateral switching device induces a two-dimensional electron gas carrier in the GaN layer adjacent to an interface between the GaN layer and the AlGaN layer, and forms a channel in a top surface portion of the GaN layer at a bottom of the recessed portion, when the gate electrode is applied with a voltage, to allow a current to flow between the source electrode and the drain electrode. The AlGaN layer includes a first AlGaN layer and a second AlGaN layer. The first AlGaN layer has an Al mixed crystal ratio that determines Ns. The second AlGaN layer has an Al mixed crystal ratio that determines Ns, and is smaller than the Al mixed crystal ratio of the first AlGaN layer to induce negative fixed charge. The second AlGaN layer is disposed in contact with the gate structure part and is spaced from the source electrode and the drain electrode.

As described above, the second AlGaN layer is formed only in an area from a side surface of the recessed portion with a predetermined width, and is not formed in areas vicinities of the source electrode and the drain electrode. Therefore, it is possible to suppress the increase in the on resistance as much as possible. Also, the blocking breakdown voltage can be improved based on the amount of fixed charge that is reduced as being offset by the first AlGaN layer and the second AlGaN layer. Since the gate structure part is provided in the recessed portion, the 2 DEG is not formed under the gate structure part. Therefore, it is possible to provide a normally-off device. Accordingly, a semiconductor device, which is a normally-off device, and is capable of suppressing the degradation of blocking breakdown voltage and the increase in the on resistance, is achieved.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

The following will describe the embodiments of the present disclosure based on the drawings. In the following description of the different embodiments, like or equivalent component parts are designated by like reference characters or numerals.

First Embodiment

Figure 1:
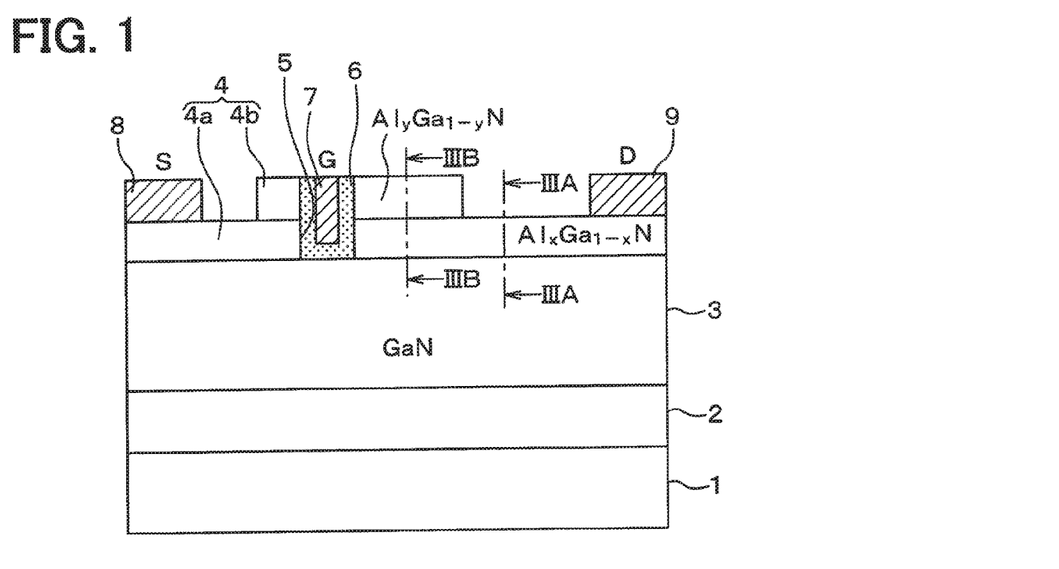
FIG. 1 is a cross-sectional view of a semiconductor device having a lateral HEMT according to a first embodiment of the present disclosure.

A first embodiment of the present disclosure will be described with reference to FIG. 1. As shown in FIG. 1, a semiconductor device of the present embodiment is provided with a lateral HEMT as a switching device.

The lateral HEMT of the present embodiment is provided by employing a structure in which a GaN layer 3 of an i-type, n-type or p-type is laid on a surface of a substrate 1 through a buffer layer 2, as a compound semiconductor substrate. On the surface of the GaN layer 3, an AlGaN layer 4 in which a first AlGaN layer 4a and a second AlGaN layer 4b are layered is formed. The GaN layer 3 and the AlGaN layer 4 form a heterojunction structure. In the lateral HEMT, the GaN layer 3 and the AlGaN layer 4 serve as a channel forming layer. The lateral HEMT operates when the 2 DEG carrier is induced by a piezoelectric effect and a spontaneous polarization effect in the GaN layer 3 adjacent to an AlGaN/GaN interface.

The substrate 1 is formed of a semi-insulating film or a semiconductor material such as, Si(111), SIC or sapphire. On the substrate 1, the buffer layer 2 is formed as a base film, which enables the GaN layer 3 to be formed thereon with a favorable crystallinity. The buffer layer 2 is, for example, provided by an AlGaN—GaN superlattice layer. The buffer layer 2 may be eliminated when the GaN layer 3 can be formed on the substrate 1 with a favorable crystallinity. Note that the crystallinity mentioned herein is about a defect, dislocation, or the like in the GaN layer 3 and affects electric and optical properties.

The GaN layer 3 and the AlGaN layer 4 are formed on the buffer layer 2, for example, by a heteroepitaxial growth.

The GaN layer 3 forms an electron transit layer made of a first GaN-based semiconductor material, which is an i-GaN-, n-GaN- or p-GaN-based semiconductor material.

The AlGaN layer 4 is made of a semiconductor material having a larger band gap energy than that of the first GaN-based semiconductor material.

The AlGaN layer 4 forms an electron supply portion. In the present embodiment, the AlGaN layer 4 includes a first AlGaN layer 4a and a second AlGaN layer 4b. A recessed portion 5 for receiving a gate structure part therein is formed to penetrate the first AlGaN layer 4a and the second AlGaN layer 4b.

The first AlGaN layer 4a is composed of $Al_xGa_{1-x}N$, in which x represents an Al mixed crystal ratio. The second AlGaN layer 4b is composed of $Al_yGa_{1-y}N$, in which y represents an Al mixed crystal ratio. The Al mixed crystal ratio x of the first AlGaN layer 4a is larger than the Al mixed crystal ratio y of the second AlGaN layer 4b. The thickness of each of the first and second AlGaN layers 4a, 4b is set so that the Ns (2 DEG density) is uniquely determined by the Al mixed crystal ratio.

Figure 2:
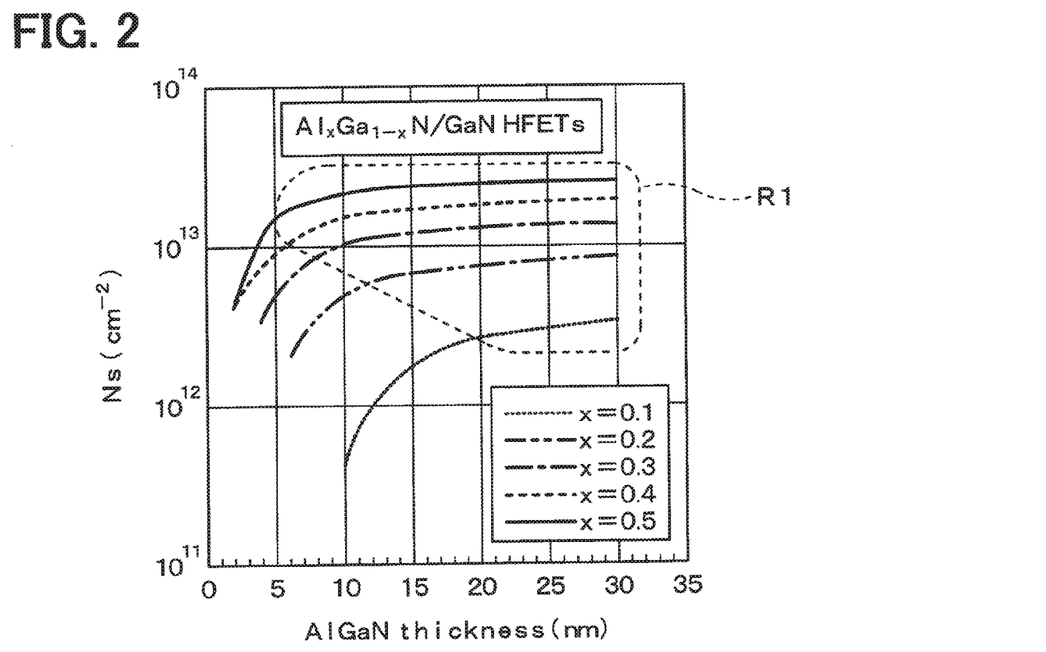
FIG. 2 is a graph showing the Al mixed crystal ratios, and the relationship between the thickness of an AlGaN layer and Ns.

Namely, the thickness of the AlGaN layer, which is a single layer, and the Ns have a relationship shown in FIG. 2. When the thickness of the AlGaN layer is small, the Ns largely changes. However, when the thickness of the AlGaN layer is greater than a certain thickness (e.g., in a region encompassed by a dashed line R1 in FIG. 2), the Ns is not affected by the thickness of the AlGaN layer, but is uniquely determined by the Al mixed crystal ratio. Therefore, each of the first and second AlGaN layers 4a, 4b has a certain thickness that does not largely affect the change of the Ns, but is uniquely determined by the Al mixed crystal ratio.

The first AlGaN layer 4a is formed on the entirety of the top surface of the substrate 1, and is removed at the recessed portion 5. The second AlGaN layer 4b is formed only in the vicinity of the recessed portion 5, that is, in the vicinity where the gate structure part is formed. The second AlGaN layer 4b is formed in a direction parallel to a plane of the substrate from the side surfaces of the recessed portion 5 with a predetermined width.

A gate electrode 7 is embedded in the recessed portion 5 through a gate insulating film 6, as the gate electrode part (G). Specifically, the gate insulating film 6 having a predetermined thickness is formed on an inner wall surface of the recessed portion, and the gate electrode 7 is formed on the gate insulating film 6, thereby forming the gate structure part.

The gate insulating film 6 is made of a silicon oxide film ($SiO_2$), alumina ($Al_2O_3$), or the like. The gate electrode 7 is made of a metal such as aluminum or platinum, an impurity doped poly-semiconductor, or the like. The gate insulating film 6 and the gate electrode 7 formed in the recessed portion 5 provide a MOS structure.

A source electrode 8 (S) and a drain electrode 9 (D) are formed on opposite sides of the gate structure part on the top surface of the first AlGaN layer 4. The source electrode 8 and the drain electrode 9 each have an Ohmic contact with the first AlGaN layer 4a. The lateral HEMT of the present embodiment is provided by the above-described structure.

Although not illustrated, a gate wiring layer, a source wiring layer and a drain wiring layer, which are made of Al or the like, are formed on the top surfaces of the gate electrode 7, the source electrode 8 and the drain electrode 9. The gate wiring layer, the source wiring layer and the drain wiring layer are electrically isolated through interlayer insulating layers, and can apply arbitrary voltages to respective electrodes.

In the semiconductor device of the present embodiment, the heterojunction structure is made of the GaN layer 3 and the AlGaN layer 4. The AlGaN layer 4 is made of the first AlGaN layer 4a and the second AlGaN layer 4b, which have different Al mixed crystal ratios. The Al mixed crystal ratio of the first AlGaN layer 4a, which is on a lower side of the second AlGaN layer 4b, has a larger Al mixed crystal ratio than that of the second AlGaN layer 4, which is on an upper side of the first AlGaN layer 4a. Further, the second AlGaN layer 4b is arranged only in the vicinity of the gate structure part. That is, the second AlGaN layer 4b is formed with a predetermined width in the direction parallel with the plane of the substrate 1 from the side surfaces of the recessed portion 5. The second AlGaN layer 4b is spaced from the source electrode 8 and the drain electrode 9.

The thickness of each of the first and second AlGaN layers 4a, 4b is determined so that the Ns of each of the first and second AlGaN layers 4a, 4b is uniquely determined by the Al mixed crystal ratio. Therefore, in a thermal equilibrium state, the GaN layer 3 and the AlGaN layer 4 at the cross-sections taken along a line and a line IIIB-IIIB in FIG. 1 have the energy band and the carrier density as shown in FIG. 3A and FIG. 3B.

Figure 3A:
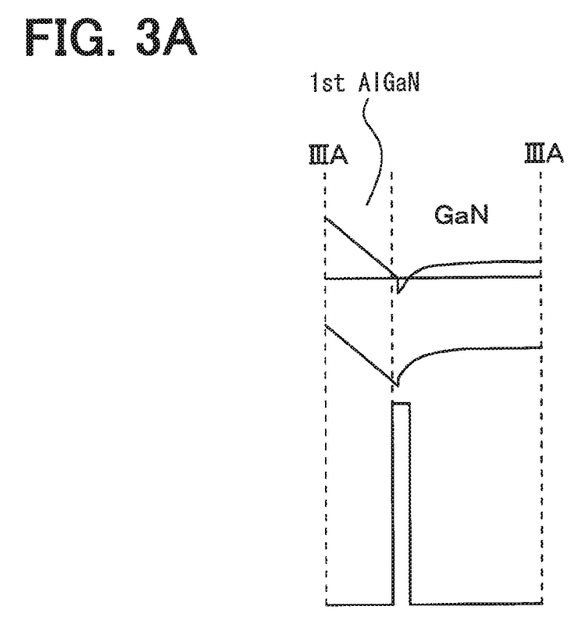
FIG. 3A is a diagram illustrating an energy band and a carrier density in a cross-section taken along a line IIIA-IIIA in FIG. 1.

That is, as shown in FIG. 3A, in the region where only the first AlGaN layer 4a is formed on the GaN layer 3, the energy band of a conduction band and a valence band at the boundary between the first AlGaN layer 4a and the GaN layer protrude downwardly. Further, negative charge is concentrated in the surface layer portion of the GaN layer 3 due to the positive fixed charge that exist with a large amount in the vicinity of the GaN layer 3 within the first AlGaN layer 4a. Therefore, the carrier density that is, the Ns is increased.

Figure 3B:
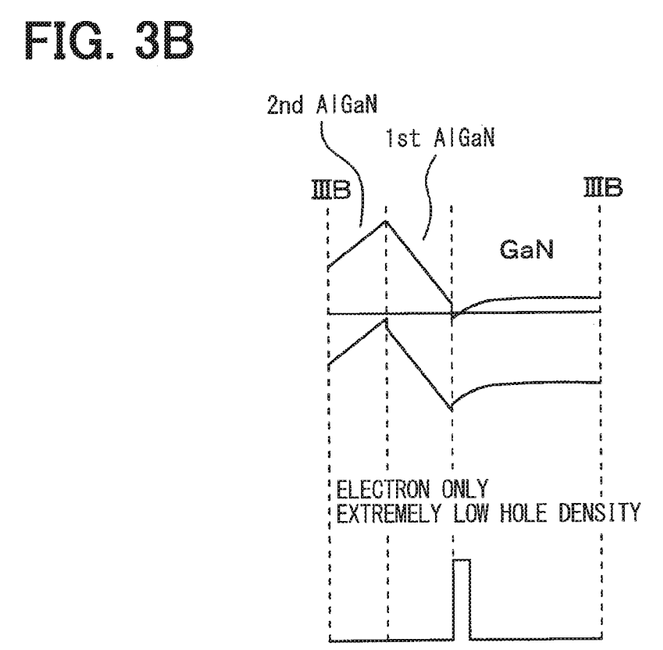
FIG. 3B is a diagram illustrating an energy band and a carrier density in a cross-section taken along a line IIIB-IIIB in FIG. 1.

As shown in FIG. 3B, on the other hand, in the region where the first AlGaN layer 4a and the second AlGaN layer 4b are formed on the GaN layer 3, the negative fixed charge is induced in the surface layer portion of the first AlGaN layer 4a at the boundary between the first AlGaN layer 4a and the second AlGaN layer 4b due to the second AlGaN layer 4b. That is, since the Al mixed crystal ratio of the second AlGaN layer 4b is smaller than that of the first Al mixed crystal ratio 4a, the negative fixed charge is induced in the surface layer portion of the first AlGaN layer 4a, Further, the Al mixed crystal ratio of the second AlGaN layer 4b is a value at which the second-dimensional hole gas (hereinafter referred to as the 2 DHG) is not generated. Therefore, the value obtained by subtracting the negative fixed charge from the positive fixed charge in the first AlGaN layer 4a is smaller in the case of FIG. 3B than that of the case of FIG. 3A, and thus the charge density Ns of the negative charges concentrating on the surface layer portion of the GaN layer 3 is reduced.

Figure 4A:
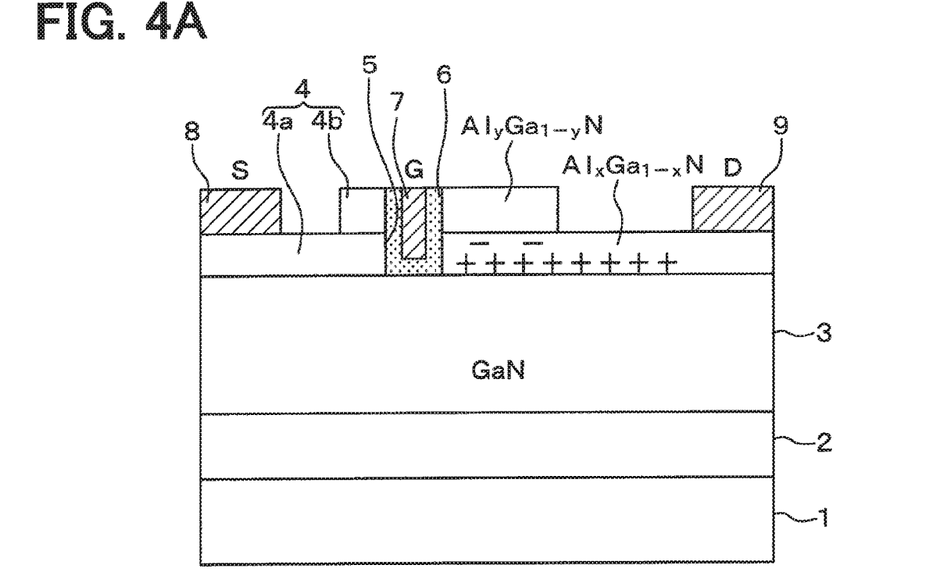
FIG. 4A is a cross-sectional view illustrating the distribution of space charge in a lateral HEMT in a blocked state.

In the blocked state, the fixed charge acts as shown in FIG. 4A. Specifically, in the region where the second AlGaN layer 4b is formed on the first AlGaN layer 4a, since the negative fixed charge exists in the surface layer portion of the first AlGaN layer 4a, the positive fixed charge at a lower portion of the first AlGaN layer 4a is effectively offset. Therefore, the field intensity in the region near the gate is reduced. On the other hand, in the region where only the first AlGaN layer 4a is formed on the GaN layer 3, the field intensity of the region near the drain is reduced due to the positive fixed charge that exists with a large amount. Therefore, since the field intensity is not locally increased, it is possible to improve the breakdown voltage. Since the 2 DEG is not generated under the gate structure part, the normally-off device is implemented.

Figure 4B:
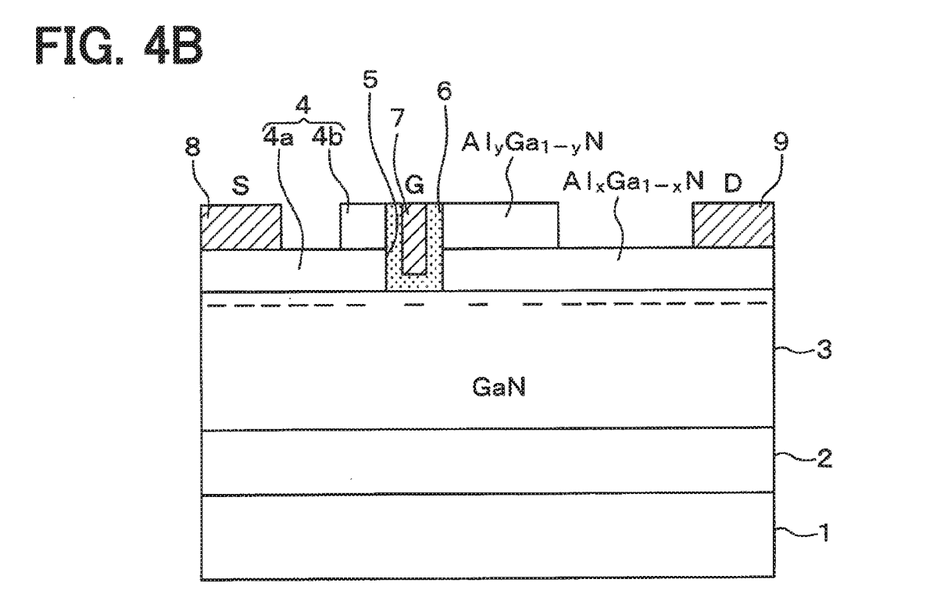
FIG. 4B is a cross-sectional view illustrating the distribution of electron in the lateral HEMT in an on state.

In the on state (conducted state), as shown in FIG. 4B, the channel portion is formed by the 2 DEG in the surface layer portion of the GaN layer 3. As a result, the current flows between the source and the drain. In the region where the second AlGaN layer 4b is formed on the first AlGaN layer 4a, the number of electrons serving as the carrier (the number of the 2 DEG carrier) can be reduced, as compared with that in the region where only the first AlGaN layer 4a is formed on the GaN layer 3. Therefore, as the area where the second AlGaN layer 4b is formed increases, the on resistance increases. In the present embodiment, however, the second AlGaN layer 4b is formed only in the area that begins from the side surface of the recessed portion 5 with the predetermined width, and is not formed in the areas near the source electrode 8 and the drain electrode 9. Therefore, it is possible to suppress the increase of the on resistance.

Figure 5:
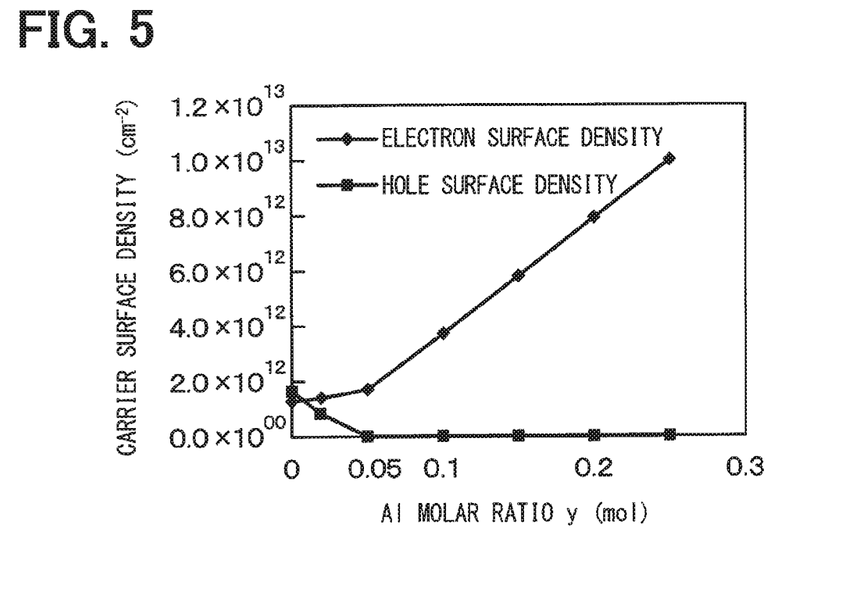
FIG. 5 is a graph illustrating a change in carrier surface density with respect to an Al molar ratio y in a second AlGaN layer in the structural diagram.

It has been described above that the 2 DHG is not generated in the surface layer portion of the first AlGaN layer 4a in the region where the first AlGaN layer 4a and the second AlGaN layer 1b are formed. However, such a situation can be generated depending on the setting of the Al mixed crystal ratio y of the second AlGaN layer 4b. For example, in a case where the first AlGaN layer 4a is 20 nm in thickness, and the second AlGaN layer 4b is 10 nm in thickness, the relationship of the Al molar ratio y (=Al mixed crystal ratio) and the carrier surface densities of the 2 DEG and the 2 DHG at the cross-section taken along IIIB-IIIB of FIG. 2 were examined, and the results shown in FIG. 5 are obtained. As shown in the results, in a range where the Al mixed crystal ratio y is 0.05 or more (though FIG. 5 only shows the results in the range from 0.05 to 0.25, it is true also in the range on or over 0.25), the 2 DEG is generated and the 2 DHG is not generated. However, in a range where the Al mixed crystal ratio y is less than 0.05, the 2 DHG is generated. Accordingly, the generation of the 2 DHG can be restricted by setting the Al mixed crystal ratio y to 0.05 or more.

As described above, in the present embodiment, the AlGaN layer 4 includes the first AlGaN layer 4a and the second AlGaN layer 4b. The second AlGaN layer 4b, which is on an upper side of the first AlGaN layer 4a, is formed only in the vicinity of the gate structure part. Further, the Al mixed crystal ratio x of the first AlGaN layer 4a is greater than the Al mixed crystal ratio y of the second AlGaN layer 4b. By this configuration, the semiconductor device, which is the normally off device and can suppress the degradation of the blocking breakdown voltage and suppress the increase in the on resistance, can be implemented.

The semiconductor device having such a configuration is basically produced by a conventional production method. However, a process of forming the AlGaN layer 4 is different from a conventional process. That is, the first AlGaN layer 4a and the second AlGaN layer 4b are successively layered on the GaN layer 3 while changing the Al mixed crystal ratios, and the second AlGaN layer 4b is then etched using a predetermined mask so that the second AlGaN layer 4b remains only in the region that is in the vicinity where the gate structure part is to be formed. Further, etching is performed from the top surface of the second AlGaN layer 4b using a predetermined mask to form the recessed portion 5 penetrating the first AlGaN layer 4a and reaching the GaN layer 3. Furthermore, a gate insulating film forming step, a gate electrode embedding and patterning step are performed to form the gate structure part. Thereafter, a step of forming the interlayer insulating film and a step of forming electric wirings are performed. Thus, the semiconductor device of the present embodiment can be produced. In this production method, the Ns is not adjusted by adjusting the thicknesses of the first and second AlGaN layers 4a, 4b by etching. Therefore, the large change of the Ns caused by the adjustment of the thicknesses will not occur, and the controllable, stable device characteristics can be expected. A very thin film, such as AlN film, which does not generate carrier, may be interposed between the first AlGaN layer 4a and the second AlGaN layer 4b to be used as an etch stopper during the etching of the second AlGaN layer 4b.

Second Embodiment

A second embodiment of the present disclosure will be described. In the present embodiment, the structure of the AlGaN layer 4 is modified from that of the first embodiment, and structures other than the AlGaN layer 4 are similar to those of the first embodiment. Therefore, only a part different from the first embodiment will be described.

Figure 6:
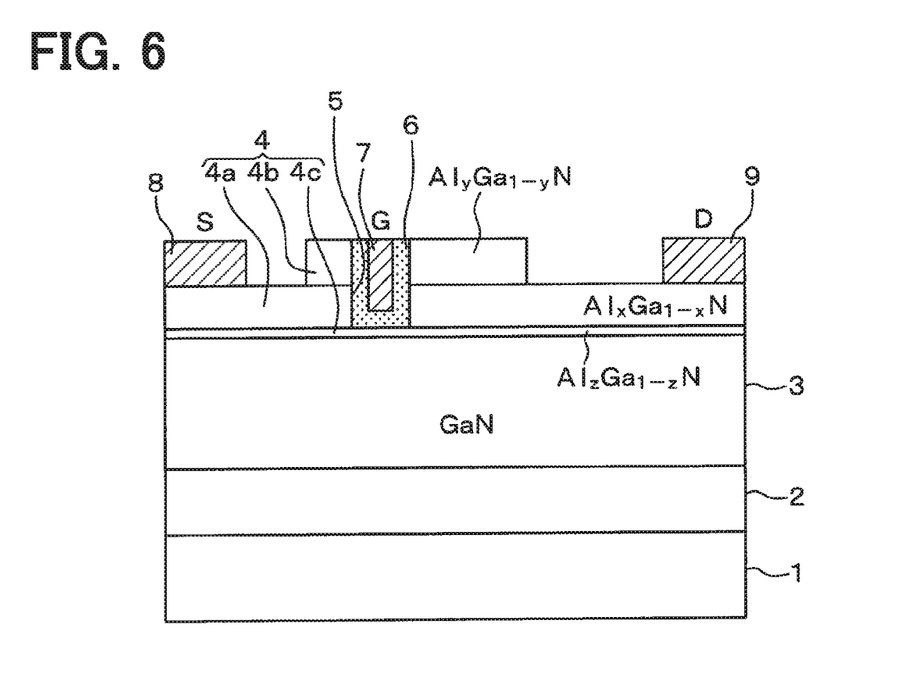
FIG. 6 is a cross-sectional view of a semiconductor device having a lateral HEMT according to a second embodiment of the present disclosure.

As shown in FIG. 6, in the present embodiment, the AlGaN layer 4 has a three-layer structure, which includes a third AlGaN layer 4c between the GaN layer 3 and the first AlGaN layer 4a and the gate structure part. The third AlGaN layer 4c is so thin that the piezoelectric polarization can be remarkably suppressed. The third AlGaN layer 4c is composed of $Al_zGa_{1-z}N$, in which z represents an Al mixed crystal ratio. The Al mixed crystal ratio z of the third AlGaN layer 4c is greater than the Al mixed crystal ratios x, y of the first and second AlGaN layers 4a, 4b.

In the case where the semiconductor device 4 has the third AlGaN layer 4c as described above, when being turned on, electrons flow in the GaN layer 3 under the third AlGaN layer 4c apart from the gate insulating film 8. Therefore, diffusion of the electrons is suppressed, and mobility improves, resulting in the reduction of the on resistance. The thickness of the third AlGaN layer 3c is set so that the piezoelectric polarization is not generated. Therefore, a threshold voltage is not reduced, and the device can be maintained as the normally-off device.

The semiconductor device of the present embodiment is produced by a production method basically similar to that of the first embodiment. In the process of forming the AlGaN layer 4, the third AlGaN layer 4c may be formed before the first AlGaN layer 4a is formed.

Third Embodiment

A third embodiment of the present disclosure will be described. In the present embodiment, the structure of the AlGaN layer 4 is modified from that of the first embodiment, and structures other than the AlGaN layer 4 are similar to those of the first embodiment. Therefore, only a part different from the first embodiment will be described.

Figure 7:
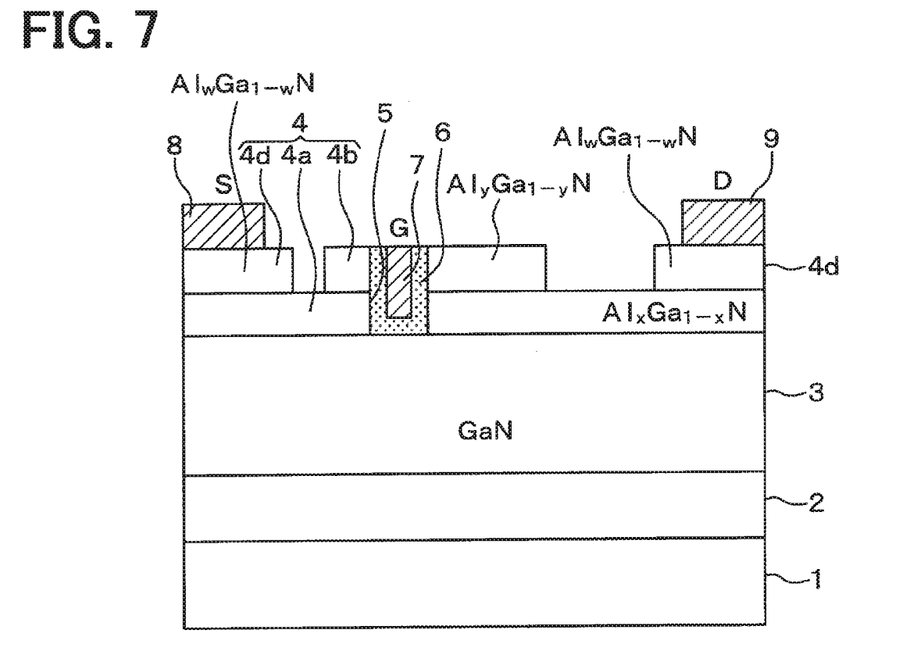
FIG. 7 is a cross-sectional view of a semiconductor device having a lateral HEMT according to a third embodiment of the present disclosure.

In the present embodiment, similarly to the first embodiment, the AlGaN layer 4 has the two-layer structure, as shown in FIG. 7. However, the AlGaN layer 4 includes a fourth AlGaN layer 4d between the first AlGaN layer 4a and the source electrode 8 and the drain electrode 9. The fourth AlGaN layer 4d is spaced from the second AlGaN layer 4b. Therefore, a region where only the first AlGaN layer 4a is formed on the GaN layer 3 remains in between the second AlGaN layer 4b and the fourth AlGaN layer 4d. The fourth AlGaN layer 4d has an Al mixed crystal ratio w, and is composed of $Al_wGa_{1-w}N$. The Al mixed crystal ratio w is greater than the Al mixed crystal ratios x, y of the first and second AlGaN layers 4a, 4b.

In the case where the semiconductor device has the fourth AlGaN layer 4d as described above, when being turned on, the Ns is increased in the surface layer portion 3 at regions corresponding to the fourth AlGaN layer 4d is formed, resulting in the reduction of the on resistance. Also, the field intensity adjacent to the drain is reduced, and the blocking breakdown voltage can be further improved.

A production method of the semiconductor device of the present embodiment is basically similar to that of the first embodiment. However, since the Al mixed crystal ratios are different, it is necessary to form the second AlGaN layer 4b and the third AlGaN layer 4d in different steps. For example, the second AlGaN layer 4b and the third AlGaN layer 4d may be formed at different positions by a method of selective epitaxial growth using a mask.

Fourth Embodiment

A fourth embodiment of the present disclosure will be described. In the present embodiment, the structure of the gate structure part is modified from that of the first to third embodiments, and structures other than the gate structure part are similar to those of the first to third embodiments. Therefore, only a part different from the first to third embodiments will be described. In the following description, the structure of the present embodiment is exemplarily employed to the structure of the first embodiment. The structure of the present embodiment will also be employed to the structures of the second and third embodiments.

Figure 8:
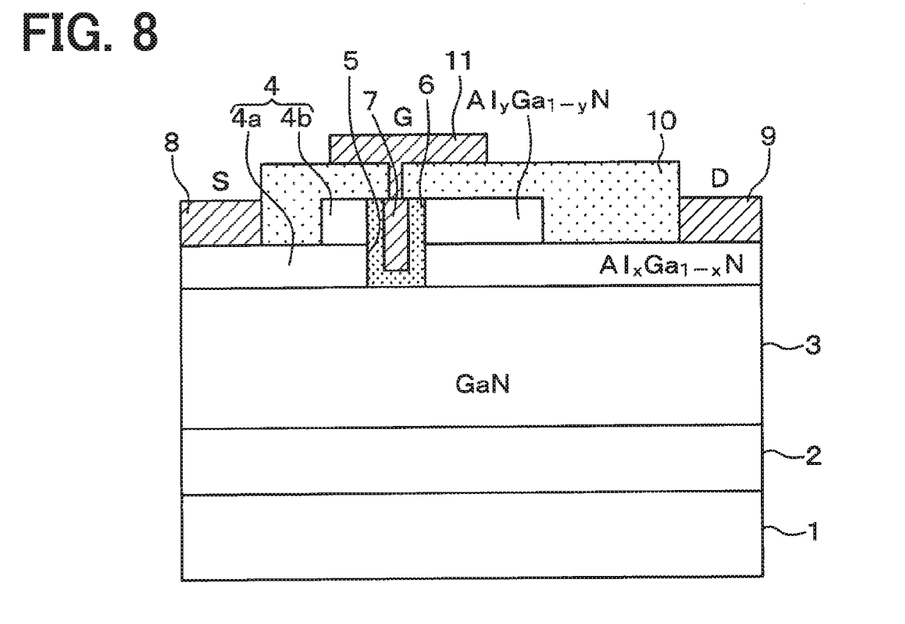
FIG. 8 is a cross-sectional view of a semiconductor device having a lateral HEMT according to a fourth embodiment of the present disclosure.

As shown in FIG. 8, in the present embodiment, the gate structure part has a T-shape (T-gate) in which a gate upper potion has a width greater than a gate lower portion and is opposed to the second AlGaN layer 4b, in a flow direction of the current between the source and the drain. In the present embodiment, the T-shaped gate is configured so that the gate upper portion 11 is made of a part of the Al wiring formed above the interlayer insulating film 10, and is electrically connected to the gate electrode 7, which forms the gate lower portion, through a contact hole of the interlayer insulating film 10. In the gate, the current flows in a direction perpendicular to the paper plane of FIG. 8. By the T-shaped gate, the cross-sectional area of the current can be increased. Therefore, it is possible to reduce the resistance of the gate, resulting in high speed.

The upper gate portion 11 projecting toward the source electrode 8 and the drain electrode 9 can serve as a gate field plate (hereinafter referred to as the GFP), and thus the blocking breakdown voltage further improves.

It is preferable that the projecting length of the gate upper portion 11 is as large as possible from the viewpoint of the reduction of internal resistance. However, it is preferable that the gate upper portion 11 does not project beyond the ends of the second AlGaN layer 4b. If the gate upper portion 11 projects over the ends of the second AlGaN layer 4b, it may reach a region where only the first AlGaN layer 4a, which has a large Ns, is formed on a side adjacent to the drain. In this case, a large potential difference occurs between the gate upper portion 11 and the portion having the large Ns. In such a case, a large electric field is generated, resulting in the degradation of the breakdown voltage.

Fifth Embodiment

A fifth embodiment of the present disclosure will be described. In the present embodiment, the structure of the source and drain is modified from that of the first to fourth embodiments, and structures other than the source and drain are similar to those of the first to fourth embodiments. Therefore, only a part different from the first to fourth embodiments will be described. In the following description, the structure of the present embodiment is exemplarily employed to the structure of the fourth embodiment. The structure of the present embodiment will also be employed to the structures of the first to third embodiments.

Figure 9:
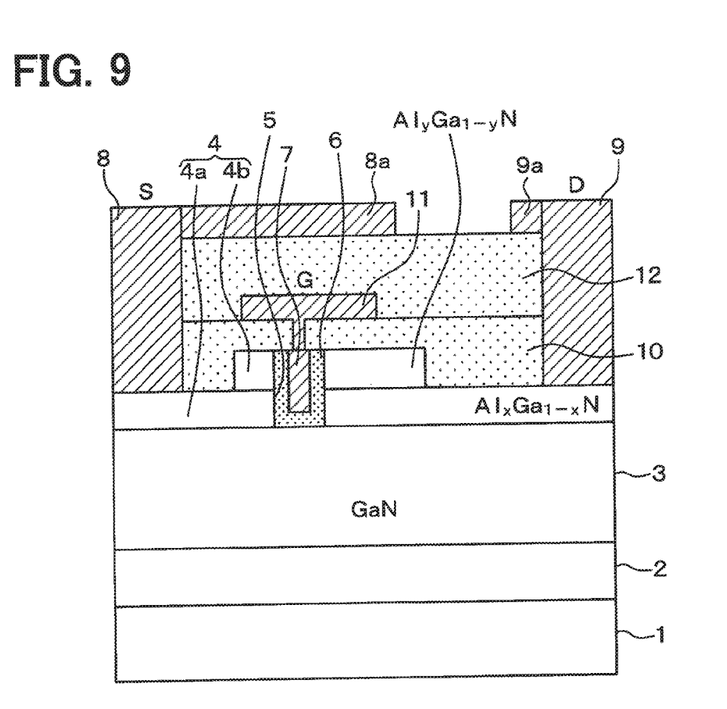
FIG. 9 is a cross-sectional view of a semiconductor device having a lateral HEMT according to a fifth embodiment of the present disclosure.

As shown in FIG. 9, in the present embodiment, the source and the drain project to form a source field stop layer (hereinafter referred to as SFP) 8a and a drain field plate (hereinafter referred to as DFP) 9a, in the current flow direction between the source and the drain. Specifically, the SFP 8a and the DFP 9a are formed by patterning the part of the Al wiring through an interlayer insulating film 12 above the gate upper portion 11. Although the source electrode 8 and the drain electrode 9 are illustrated, in FIG. 9, in straight shapes, the source electrode 8 and the drain electrode 9 are formed by stacking portions of the Al wiring through the contact hole every time the interlayer insulating film 10, 12 is formed.

Since the semiconductor device has the SFP 8a and the DFP 9a as described above, the blocking breakdown voltage can be improved, similarly to the GFP.

The projecting length of the SFP 8a is preferable so that the SFP 8a does not project from the end of the second AlGaN layer 4b adjacent to the drain. The projecting length of the DFP 9a is preferable so that the DFP 9a does not reach the end of the second AlGaN layer 4b adjacent to the drain. If the SFP 8a projects from the second AlGaN layer 4b toward the drain, it projects to a region where only the first AlGaN layer 4a is formed and the Ns is large, on a side adjacent to the drain than the gate. In this case, a large potential difference is generated in between the SFP 8a and the region having the large Ns. A large electric field is generated, resulting in the degradation of the breakdown voltage. If the DFP 9a projects to a position above the second AlGaN layer 4b, the potential of the DFP 9s adversely affects the second AlGaN layer 4b.

Sixth Embodiment

A sixth embodiment of the present disclosure will be described. In the present embodiment, the structure of the gate structure part is modified from that of the first to fifth embodiments, and structures other than the gate structure part are similar to those of the first to fifth embodiments. Therefore, only a part different from the first to fifth embodiments will be described. In the following description, the structure of the present embodiment is exemplarily employed to the structure of the fifth embodiment. The structure of the present embodiment will also be employed to the structures of the first to fourth embodiments.

Figure 10:
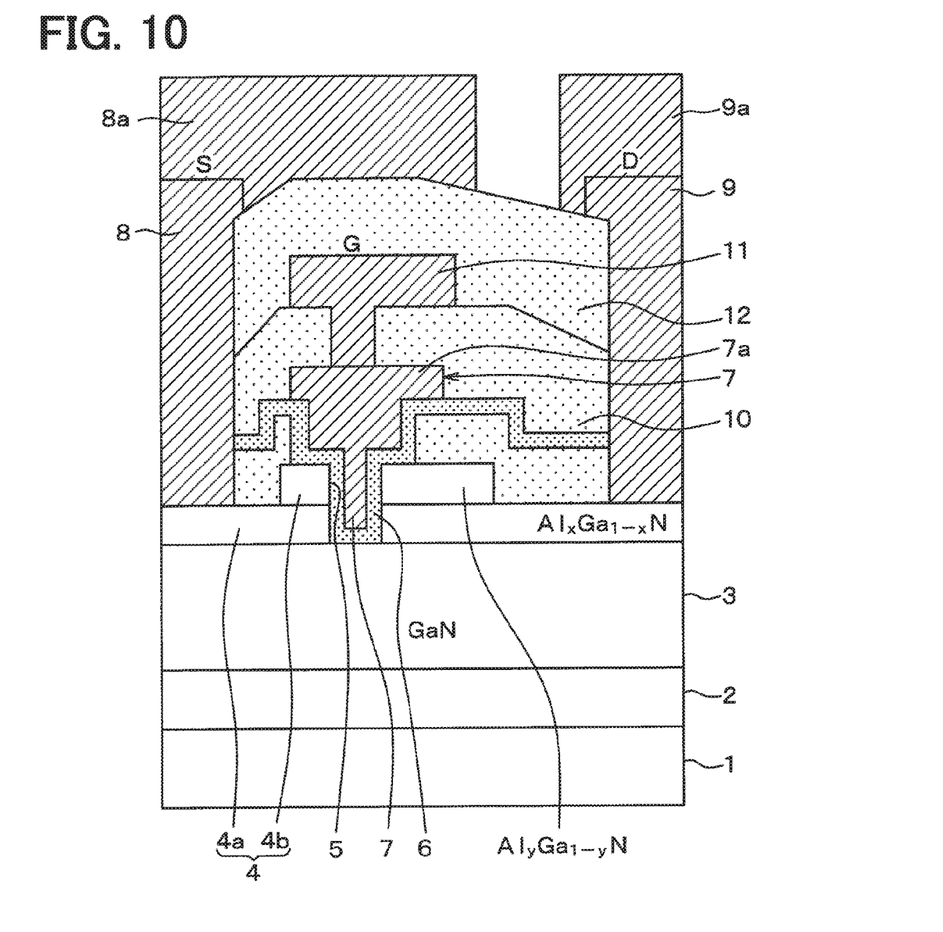
FIG. 10 is a cross-sectional view of a semiconductor device having a lateral HEMT according to a sixth embodiment of the present disclosure.

As shown in FIG. 10, in the present embodiment, the gate electrode 7 also is widened at the upper portion thereof to have a terrace portion 7a opposed to the second AlGaN layer 4b. The terrace portion 7a is disposed above the second AlGaN layer 4b to be opposed to the second AlGaN layer 4b. In the case where the gate electrode 7 has the terrace portion 7a, a leak current between the source and the drain, when being turned off, can be reduced by the suppression of DIBL (Drain Induced Barrier Lowering). At the time of being turned off, the gate is applied with a potential same as or minus of the source and the drain is applied with a positive potential. If the drain voltage is excessively large, the electric field enters under the gate, resulting in an occurrence of leak current. The reduction of barrier of the gate caused by the drain voltage can be suppressed, and an increase in the leak current due to electron current from the source to the drain can be suppressed.

Seventh Embodiment

A seventh embodiment of the present disclosure will be described. In the present embodiment, the structure of the AlGaN layer 4 is modified from that of the first to sixth embodiments, and structures other than the AlGaN layer 4 are similar to those of the first to sixth embodiments. Therefore, only a part different from the first to sixth embodiments will be described. In the following description, the structure of the present embodiment is exemplarily employed to the structure of the first embodiment. The structure of the present embodiment will also be employed to the structures of the first to fifth embodiments.

Figure 11:
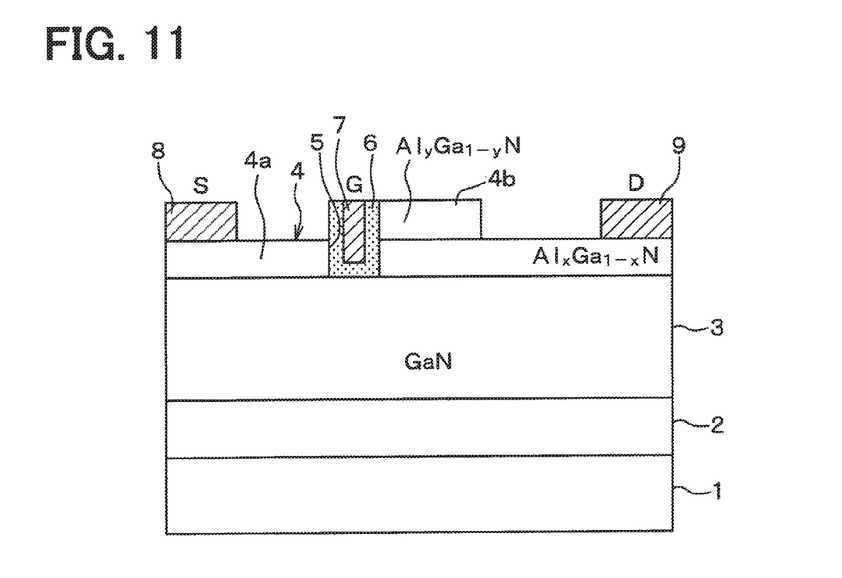
FIG. 11 is a cross-sectional view of a semiconductor device having a lateral HEMT according to a seventh embodiment of the present disclosure.

As shown in FIG. 11, in the present embodiment, the second AlGaN layer 4b is disposed only on a side of the gate structure part adjacent to the drain, and is not disposed on a side of the gate structure part adjacent to the source. In this way, the second AlGaN layer 4b can be disposed only on the drain side of the gate structure part. In this case, the area having a small 2 DEG density is reduced, whereas the area having a large 2 DEG density is increased. Therefore, the on resistance can be further reduced.

The present disclosure is not limited to the embodiments described above, but can be suitably modified. Further, features in the above described embodiments may be combined in any ways as long as there are no hindrance.

For example, in the fifth embodiment, the structure having both the SFP 8a and the DFP 9a is described. However, the semiconductor device may have either the SFP 8a or the DFP 9a.

In each of the above-described embodiments, the recessed portion 5 has the depth so that the surface of the GAN layer 3 is exposed. However, such a depth is an example. For example, the recessed portion 5 may have a depth so that the surface layer portion of the GaN layer 3 is partly removed. As another example, the recessed portion 5 may have a depth so that the first AlGaN layer 4a partly remains at the bottom of the recessed portion 5 with a thickness that restricts generation of the 2 DEG carrier.

It is understood that the present disclosure has been described in accordance with the embodiments, but the present disclosure is not limited to the embodiments and the structures thereof. The present disclosure also encompasses variations in the equivalent range as various modifications. In addition, various combinations and embodiments, and further, only one element thereof, less or more, and the form and other combinations including, are intended to fall within the spirit and scope of the present disclosure.

The invention claimed is:
1. A semiconductor device comprising:
a lateral switching device including:
a substrate formed of a semi-insulating material or a semiconductor material; a channel forming layer disposed on the substrate, the channel forming layer including a heterojunction structure made of a GaN layer and an AlGaN layer, the GaN layer forming an electron transit layer, the AlGaN layer forming an electron supply portion, the channel forming layer being formed with a recessed portion at which the AlGaN layer is partly removed;
a planar gate structure part including a gate insulating film disposed in the recessed portion contacting the GaN layer and a gate electrode disposed on the gate insulating film; and
a source electrode and a drain electrode disposed on opposite sides of the gate structure part, wherein
the lateral switching device induces a two-dimensional electron gas carrier in the GaN layer adjacent to an interface between the GaN layer and the AlGaN layer, and forms a channel in a top surface portion of the GaN layer at a bottom of the recessed portion, when the gate electrode is applied with a voltage, to allow a current to flow between the source electrode and the drain electrode,
the AlGaN layer is a two layer structure which includes:
a first AlGaN layer wherein an Al mixed crystal ratio of the first AlGaN layer determines a two-dimensional electron gas carrier density; and
a second AlGaN layer, wherein a value of an Al mixed crystal ratio of the second AlGaN layer determines a two-dimensional electron gas carrier density and is smaller than the Al mixed crystal ratio of the first AlGaN layer, such that the second AlGaN layer is configured to induce a negative fixed charge in a surface layer portion of the first AlGaN layer, and the Al mixed crystal ratio of the second AlGaN layer restricts generation of two-dimensional hole gas in the surface layer portion of the first AlGaN layer,
the value of the Al mixed crystal ratio of the second AlGaN layer is 0.05 or more and less than 0.25,
the source electrode and the drain electrode are directly located on the first AlGaN layer, and the second AlGaN layer is in contact with the gate structure part on both sides and is spaced from the source electrode and the drain electrode.

* * * * *